United States Patent (10) Patent No.: US 7,880,217 B2
Sung et al. (45) Date of Patent: Feb. 1, 2011

(54) PROGRAMMABLE NON-VOLATILE MEMORY (PNVM) DEVICE

(75) Inventors: Hung-Cheng Sung, Hsinchu (TW); Te-Hsun Hsu, Hsinchu (TW); Shih-Wei Wang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 121 days.

(21) Appl. No.: 11/192,669

(22) Filed: Jul. 30, 2005

(65) Prior Publication Data

US 2007/0023822 A1 Feb. 1, 2007

(51) Int. Cl.
*H01L 29/788* (2006.01)
(52) U.S. Cl. .................................. 257/317; 257/E29.3
(58) Field of Classification Search ................. 257/317, 257/E29.3
See application file for complete search history.

(56) References Cited

U.S. PATENT DOCUMENTS

| 4,568,319 | A | 2/1986 | Samata |
| 5,216,257 | A | 6/1993 | Brueck et al. |
| 5,368,992 | A | 11/1994 | Kunitsugu |
| 5,380,678 | A * | 1/1995 | Yu et al. ..................... 438/627 |
| 5,415,358 | A | 5/1995 | Yamaguchi |
| 5,501,122 | A | 3/1996 | Leicht et al. |
| 6,242,160 | B1 | 6/2001 | Fukuzawa |
| 6,380,039 | B2 * | 4/2002 | Badenes et al. ............. 438/301 |
| 6,429,480 | B1 | 8/2002 | Koishikawa |
| 6,501,122 | B1 * | 12/2002 | Chan et al. .................. 257/315 |
| 2002/0020860 | A1 * | 2/2002 | Arai ........................... 257/260 |
| 2002/0028060 | A1 | 3/2002 | Murata et al. |
| 2003/0227047 | A1 * | 12/2003 | Hsu et al. .................... 257/314 |
| 2004/0099900 | A1 * | 5/2004 | Iguchi et al. ................ 257/315 |
| 2004/0110092 | A1 | 6/2004 | Lin |

FOREIGN PATENT DOCUMENTS

| TW | 473816 | 1/2002 |
| TW | 495837 | 7/2002 |
| TW | 557408 | 10/2003 |
| TW | 577109 | 2/2004 |

* cited by examiner

*Primary Examiner*—Bradley K Smith
*Assistant Examiner*—Amar Movva
(74) *Attorney, Agent, or Firm*—Tung & Associates

(57) ABSTRACT

A programmable non-volatile memory (PNVM) device and method of forming the same compatible with CMOS logic device processes to improve a process flow, the PNVM device including a semiconductor substrate active area; a gate dielectric on the active area; a floating gate electrode on the gate dielectric; an inter-gate dielectric disposed over the floating gate electrode; and, a control gate damascene electrode extending through a dielectric insulating layer in electrical communication with the inter-gate dielectric, the control gate damascene electrode disposed over an upper portion of the floating gate electrode.

19 Claims, 5 Drawing Sheets

PROGRAMMABLE NON-VOLATILE MEMORY (PNVM) DEVICE

FIELD OF THE INVENTION

This invention generally relates to programmable non-volatile memory (PNVM) devices such as EEPROM and Flash memory devices and more particularly to a PNVM device and method for forming the same including an improved process flow.

BACKGROUND OF THE INVENTION

In flash memory and EEPROM (Electrically Erasable Programmable Read Only Memory) devices, a floating gate transistor and a control gate are critical components for performing read and write operations.

Prior art processes for forming a memory cell including control gate and floating gate components typically require a complex series of photolithographic patterning and etching processes to form the floating gate, and overlying inter-gate dielectric, and control gate. For example, in prior art processes, a complex series of steps has been required to form floating gate electrodes, followed by formation of an inter-gate dielectric layer, followed by formation of an overlying polysilicon layer with a hardmask and a complex multi-step etching process to form adjacent self-aligned electrodes (e.g., word line electrodes).

The formation of logic (CMOS) devices and PNVM devices according to prior art processes is generally incompatible as the PNVM device process flow requires several extra dielectric layer formation, patterning, and etching steps to form the PNVM device cell components. When the formation of logic (CMOS) devices and PNVM devices takes place in parallel on separate active area portions of a semiconductor process wafer, the process flow becomes even more complex in adding the required processing steps to form the PNVM cell areas. As a result, the production cycle time is lengthy and the production cost is high.

There is therefore a need in the PNVM device processing art to develop novel PNVM devices that are compatible with logic device processes to improve a process flow while maintaining device operability and reliability.

It is therefore an object of the invention to provide a novel PNVM device that is compatible with logic device processes to improve a process flow while maintaining device operability and reliability, in addition to overcoming other deficiencies and shortcomings of the prior art.

SUMMARY OF THE INVENTION

To achieve the foregoing and other objects, and in accordance with the purposes of the present invention as embodied and broadly described herein, the present invention provides a programmable non-volatile memory (PNVM) device and method of forming the same compatible with CMOS logic device processes to improve a process flow.

In a first embodiment, the PNVM device includes a semiconductor substrate active area; a gate dielectric on the active area; a floating gate electrode on the gate dielectric; an inter-gate dielectric disposed over the floating gate electrode; and, a control gate damascene electrode extending through a dielectric insulating layer in electrical communication with the inter-gate dielectric, the control gate damascene electrode disposed over an upper portion of the floating gate electrode.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to an exemplary portion of a programmable non-volatile memory (PNVM) cell, it will be appreciated that the method of the present invention may be applied to single or multiple transistor cells in the formation of PNVM devices in general including EEPROM and Flash memory cells.

Figure 1A:
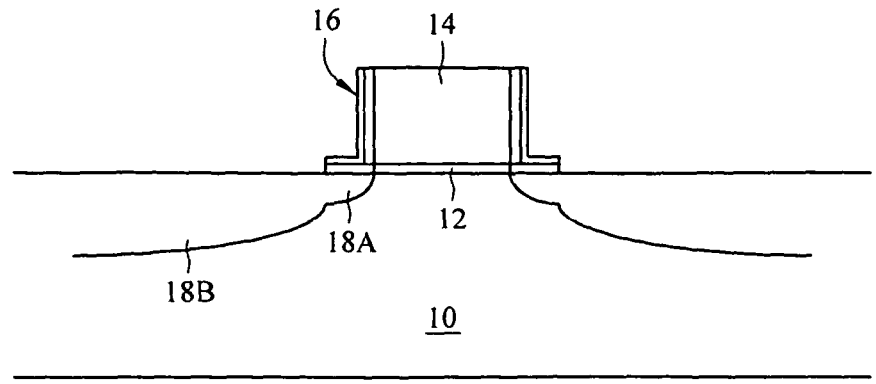
FIGS. 1A-1F are cross sectional schematic views of a portion of an exemplary PNVM device at stages in manufacture according to an embodiment of the present invention.

Shown in FIG. 1A is a semiconductor substrate, 10, showing an active area portion of a PNVM cell, having shallow trench isolation (STI) structures (not shown) formed by conventional methods to surround and electrically isolate the active area. Conventional CMOS device formation processes are then carried out to form the active area optionally in parallel with the formation of CMOS logic devices (not shown) including N and P well implants, depending on the polarity of the device, gate dielectric 12 formation, and gate electrode 14 formation. It will be appreciated that adjacent transistor structures (not) shown may be formed to form a PNVM cell having multiple (more than one) floating gate transistors. Additional ion implant processes, specific to particular PNVM cells, may optionally be carried out over the PNVM active area. For example, additional cell well P/N implants and/or a high Voltage (HV) PW/NW implant may be carried out for the formation of high Voltage PNVM devices. The semiconductor substrate 10 may include, but is not limited to, silicon, silicon on insulator (SOI), stacked SOI (SSOI), stacked SiGe on insulator (S—SiGeOI), SiGeOI, and GeOI, and combinations thereof.

Still referring to FIG. 1A, the gate dielectric 12, also referred to as a tunnel oxide in PNVM devices, is formed by conventional CMOS (logic) device formation processes including forming the gate dielectric layer on the semiconductor substrate 10 active area including, but not limited to, chemical, thermal, or CVD deposition methods. Preferably a thermal growth method to grow $SiO_2$ to provide a tunneling thickness (e.g., greater than about 40 Angstroms) is preferred, and may include subsequent nitridization and/or doping processes. It will be appreciated that high-K dielectrics (e.g., $K \geq 8$) may be also be used such as aluminum oxides (e.g., $Al_2O_3$), hafnium oxides (e.g., $HfO_2$), hafnium oxynitrides (HfON), hafnium silicates (e.g. $HfSiO_4$), hafnium silicon oxynitrides (e.g., $HfSi_xO_yN_z$), zirconium oxides (e.g., $ZrO_2$), zirconium oxynitrides (e.g., ZrON), zirconium silicon oxides (e.g., $ZrSiO_2$), yttrium oxides (e.g., $Y_2O_3$), lanthanum oxides (e.g., $La_2O_3$), cerium oxides (e.g., $CeO_2$), titanium oxides (e.g., $TiO_2$), tantalum oxides (e.g., $Ta_2O_5$), or combinations thereof.

The floating gate electrode portion 14 is preferably formed of polysilicon, amorphous polysilicon, doped polysilicon, polysilicon-germanium, or combinations thereof. For example, gate electrode material is first deposited followed by an optional hardmask layer (not shown) e.g., silicon oxide, silicon nitride, silicon oxynitride, or combinations thereof followed by conventional lithographic patterning and dry etching methods to form the floating gate structure including floating gate electrode portion 14 and tunnel oxide portion 12. In the PNVM device as further shown below, the gate electrode 14 portion advantageously functions as a floating gate electrode, obviating separate and additional photolithographic patterning and etching steps required in prior art processes of forming PNVM device floating gate electrodes.

Still referring to FIG. 1A, an LDD ion implant is first carried out to form LDD doped regions e.g., 18A followed by formation of sidewall spacers e.g., 16, followed by a relatively higher dose ion implant to form bit line landing area doped regions (S/D regions) e.g., 18B. The sidewall spacers may be formed of, for example, composite oxide/nitride layers in a conventional triangular shape, or in an L-shaped configuration as shown by first forming a silicon oxide layer; followed by forming a silicon nitride and/or silicon oxynitride layer; followed by a wet and/or dry etch process. The sidewall spacers, e.g., 16, are preferably formed in an L-shape configuration in order to advantageously reduce the cell size of a PNVM cell e.g., about 0.9 to about 7 square microns depending on the number of transistors per cell. It will be appreciated that the above processes, being compatible with CMOS logic device formation processes, may be carried out in parallel with formation of CMOS logic devices on a separate active area of the process wafer including forming embedded memory devices.

Figure 1B:
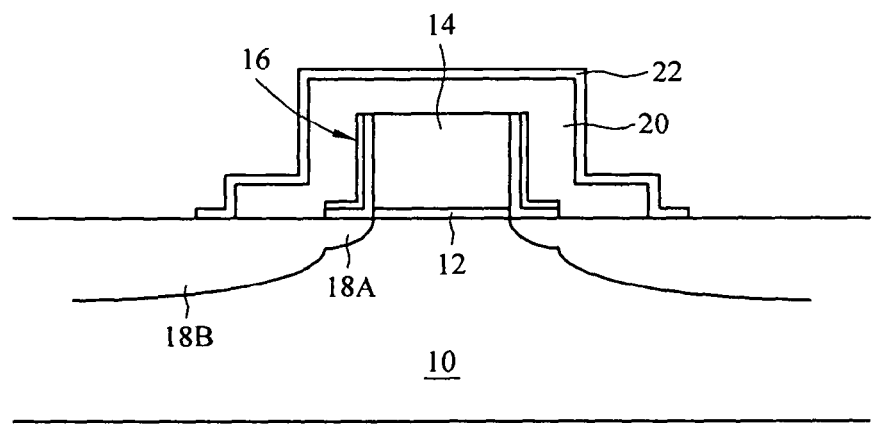

Referring to FIG. 1B, in an important aspect of the invention, in one embodiment, one or more dielectric layers 20 are formed over the gate structure including the sidewall spacers. A contact etch stop layer 22, for example silicon nitride and/or silicon oxynitride, is then optionally formed on the dielectric layer 20, followed by an etch process to expose semiconductor substrate 10 contact area portions overlying the source/drain region portions e.g., 18B, adjacent the gate structure. The IGD layer 20, may be formed of a single layer of PECVD silicon oxide (PEOX), composite layers such as an oxide/nitride/oxide (ONO) layers formed by sequential PECVD and/or LPCVD deposition processes, high-K dielectrics, such as aluminum oxide (e.g., $Al_2O_3$) or hafnium oxide (e.g., $HfO_2$ or HfO), or combinations of the foregoing. It will be appreciated that other high-K dielectric materials may be used including those outlined for the gate dielectric layer 12, above. For example, the equivalent oxide thickness (EOT) (i.e., equivalent dielectric properties to a silicon dioxide thickness) of the IGD layer is preferably from about 50 Angstroms to about 200 Angstroms.

Advantageously the IGD layer 20 including the contact etch stop layer additionally function as a protective layer to protect areas of the gate structure from silicidation in a subsequent salicide formation process. Forming the IGD layer in this manner is compatible with a CMOS process of forming a protective oxide layer (e.g., RPO) over CMOS logic device gate structures, thereby improving a process flow including enabling the same process steps to be used in parallel logic device formation. Moreover, a separate patterning and etching process required to form the IGD layer in PNVM devices of the prior art is eliminated.

Figure 1C:
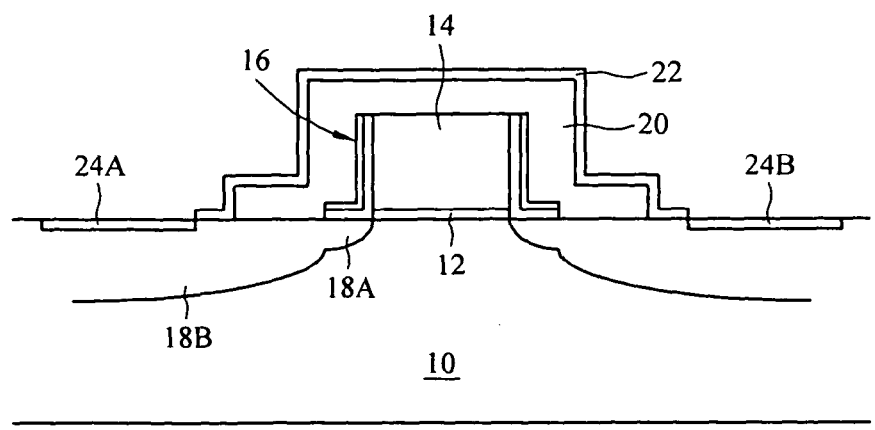

Referring to FIG. 1C, a conventional self aligned silicide (salicide) formation process is then carried out to form metal silicides, e.g., 24A and 24B, formed over the exposed semiconductor substrate contact areas, preferably formed of cobalt silicide (e.g., $CoSi_2$), titanium silicide (e.g., $TiSi_2$), or nickel silicide (e.g., NiSi).

Figure 1D:
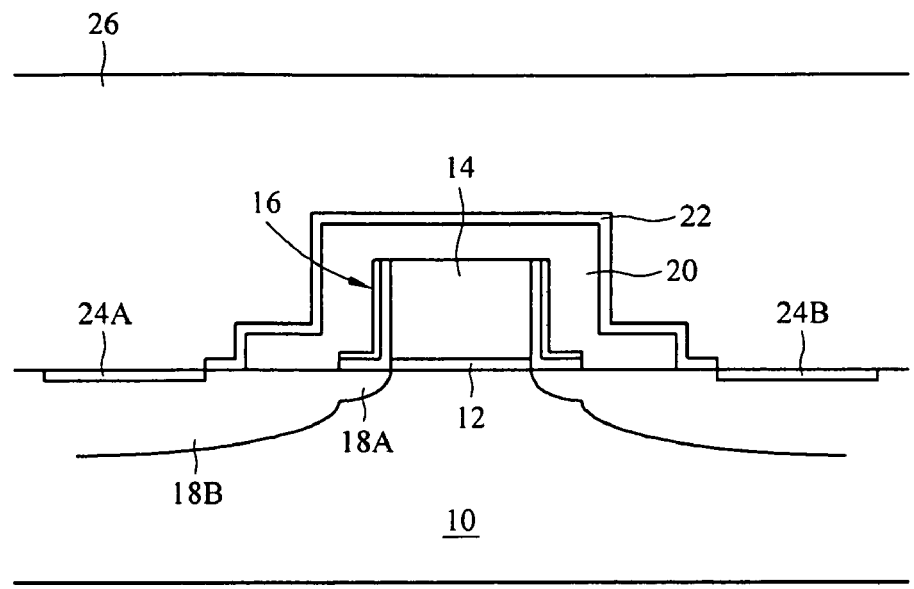

Referring to FIG. 1D, a pre-metal dielectric (PMD) layer 26, also referred to as an inter-layer dielectric (ILD) layer, is then formed by conventional deposition processes over the floating gate structure including over the IGD layer 20. The PMD layer 26 may be formed of an insulating dielectric oxide material such as boro-phospho-silicate glass (BPSG) and/or TEOS oxide by known CVD processes, followed by a CMP process to planarize the surface.

Figure 1E:
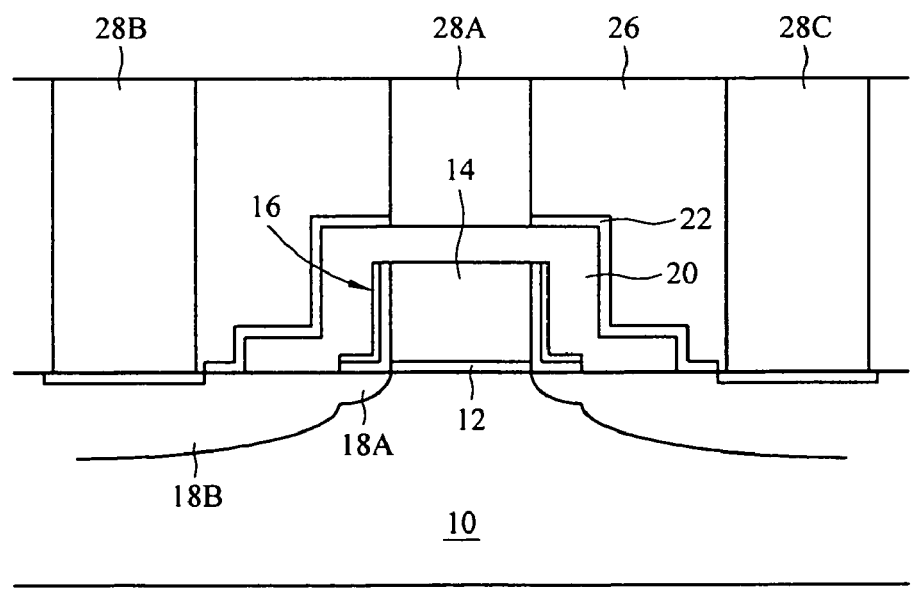

Referring to FIG. 1E, a conventional photolithographic patterning and dry etching process is then carried out to form bi-level contact openings, including a contact opening e.g., 28A extending through the contact etch stop layer 22 to form closed communication with (contact) the IGD layer 20 and contact via openings 28B and 28C are formed to form closed communication with (contact) the metal silicide portions 24A and 24B. The contact openings are then backfilled (e.g., deposited and planarized) with a conductive material such as aluminum or tungsten, preferably tungsten, by conventional damascene formation processes.

In an important aspect of the invention, the contact opening 28A is formed having about the same width (e.g., 1500 to 2400 Angstroms) or slightly less width (e.g., 100 to 500 Angstroms) than the floating gate portion 14 to form a control gate electrode in contact with the IGD layer e.g., 20. Advantageously, the same patterning and etching steps may be used to form the contacts 28B and 28C, as well as the control gate portion 28A, since the etch stop layer 22 allows bi-level contact etching. Again, the process of the present invention is compatible with CMOS logic device processes thereby improving a process flow including eliminating separate patterning and etching steps such as those required for carrying out a self aligned gate etching (SGE) process to form a control gate (e.g., adjacent the floating gate) according to prior art processes.

Figure 1F:
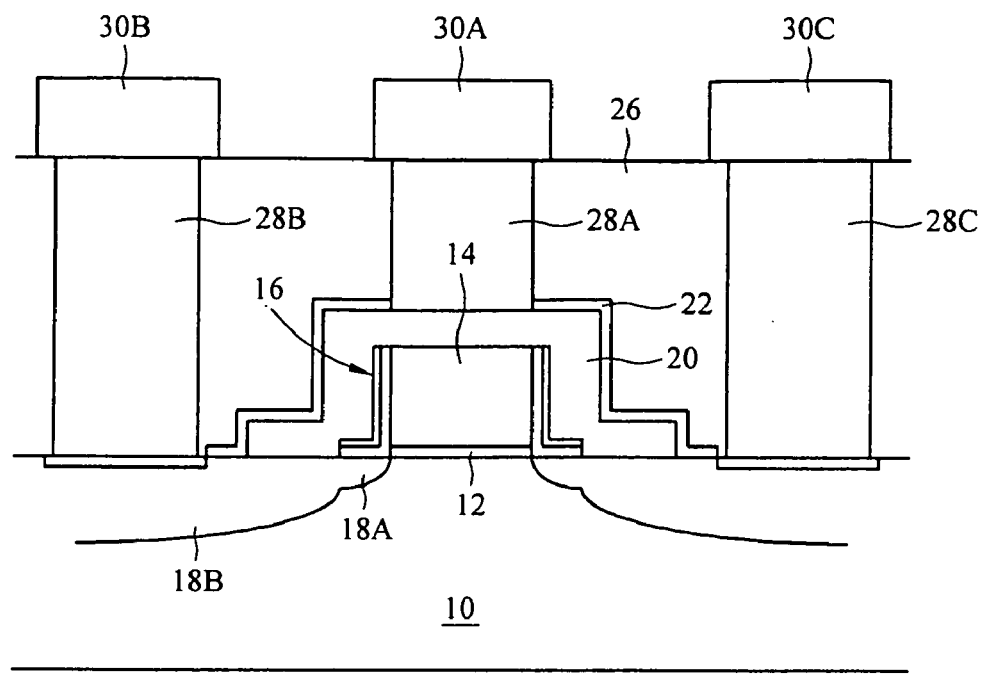

Referring to FIG. 1F, a conventional metallization layer formation process is then carried out, e.g., either a damascene formation or metal deposition and etching process to form conductive interconnect lines e.g., 30A, 30B, and 30C, formed respectively over the contacts 28A, 28B, and 28C, where the interconnect line 30A forms a word line in electrical communication with the control gate portion 28A, and interconnect lines e.g., 30B and 30C form bit lines in communication with contact vias 28B and 28C. It will be appreciated that one of the interconnect lines 30B or 30C may form a bit line in an adjacent floating gate/control gate structure (not shown).

Figure 3:
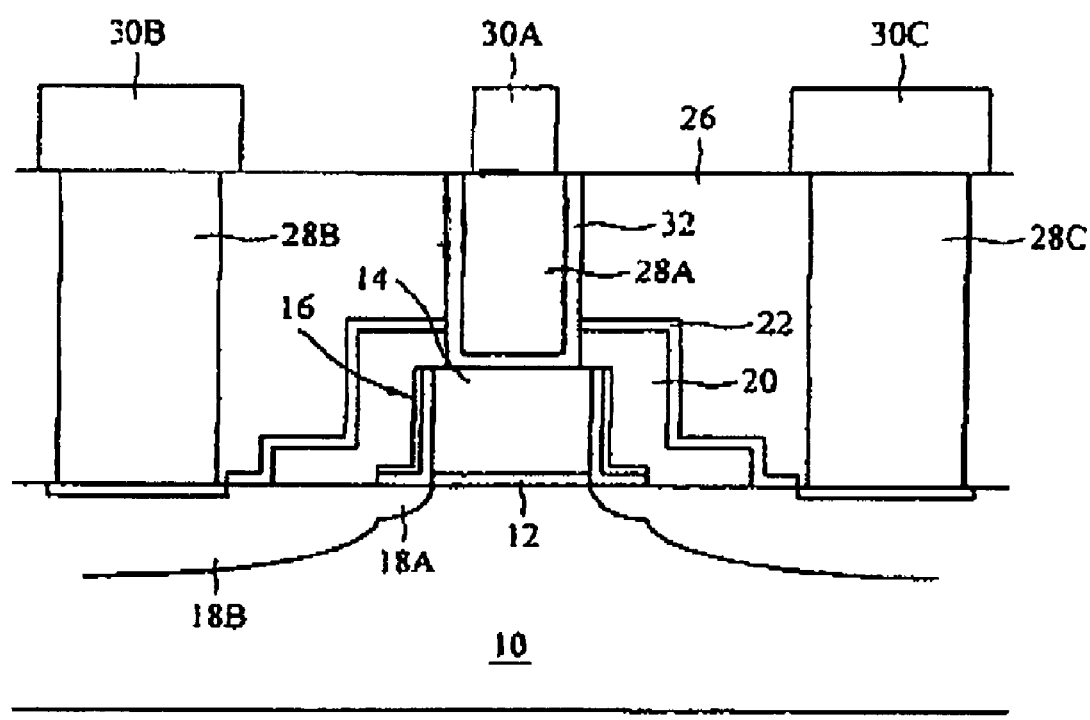
FIG. 3 is a cross sectional schematic view of a portion of an exemplary PNVM device according to an embodiment of the present invention.

Referring to FIG. 3, is shown an alternative embodiment of the PNVM device of the present invention. In this embodiment, components similarly numbered are the same as shown in FIGS. 1A-1F and formed by similar processes. In this embodiment however, the dielectric layer 20 functions as a protective oxide layer (e.g., an RPO layer) and the IGD layer 32 is now formed to line the control gate electrode opening following etching of the opening to stop on the floating gate portion 14 and prior to backfilling with a conductive material 28A, e.g., tungsten, to form the control gate electrode. The IGD layer 32 of this embodiment may be formed of same material previously outlined for preferred embodiments for the formation of IGD layer shown as dielectric layer 20 in FIG. 1B e.g., plasma oxide (e.g., PEOX), aluminum oxide, and hafnium oxide, as well as other high-K dielectrics. In addition, separate photolithographic patterning and etching steps may be carried out to etch the damascene openings to form contact vias, 28B and 28C, and the control gate 28A to avoid overetching the upper portion of the floating gate, in which case the formation of contact etch stop layer 22 is optional. The conductive interconnect wordline 30A is preferably formed to contact only the conductive portion of control gate electrode 28A.

Thus, a novel PNVM device and method for forming the same has been presented where processes compatible with CMOS logic processes are used thereby allowing parallel formation of CMOS logic devices as well as reducing the number of required processing steps (e.g., separate floating gate, IGD, and self aligned gate patterning and etching processes) compared to prior art processes, thereby improving a process flow to reduce cycle time and cost while maintaining write (programming) and erase operations (e.g., EEPROM and Flash memory) performance.

Figure 2:
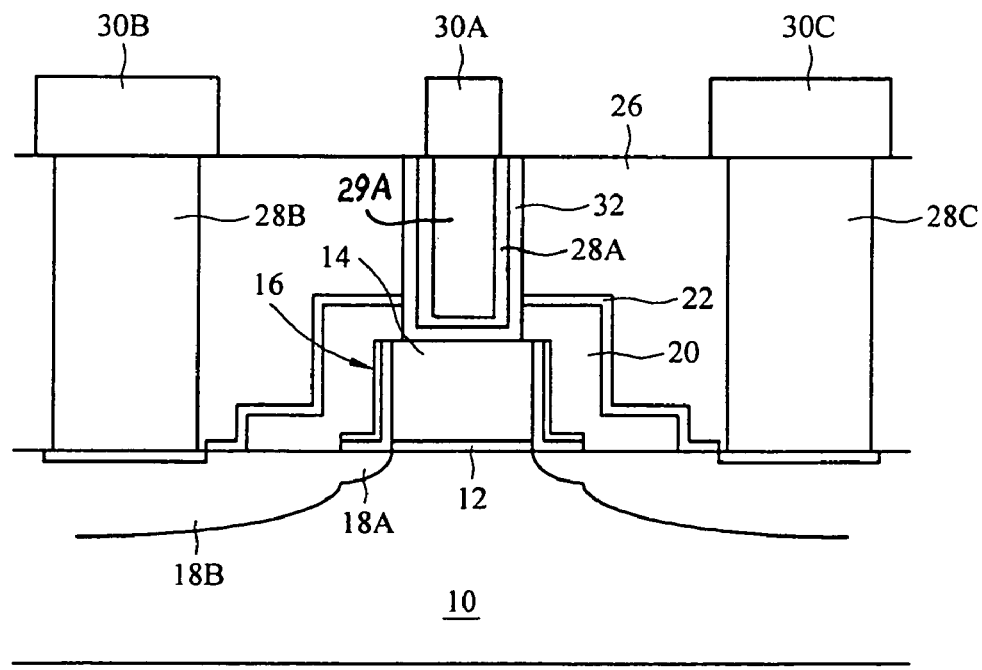
FIG. 2 is a cross sectional schematic view of a portion of an exemplary PNVM device according to an embodiment of the present invention.

Referring to FIG. 2, is shown again an alternative embodiment of the PNVM device of the present invention. In this embodiment, components similarly numbered are the same as shown in FIGS. 1A-1F and formed by similar processes. In this embodiment however, the control gate electrode 28A is now formed as a liner layer to substantially line the top of the IGD layer 32 lining the contact opening. To line the IGD layer 32, the control gate electrode 28A is formed preferably by a Chemical Vapor Deposition(CVD) method such as PECVD, LPCVD, MOCVD or ALCVD. After deposition of conformal CVD liner layer 28A, a chemical mechanical polishing process is then performed to form CVD liner control gate electrode 28A. The CVD liner control gate electrode 28A can be a conductor selected from the group consisting of tungsten, aluminum, aluminum alloy, copper, copper alloy, metal nitride, and combinations thereof. As shown in FIG. 2, the conductive interconnect wordline 29A/30A includes a damascene structure 29A filling the control gate electrode opening on top of the control gate electrole 28A. Conductive interconnect portion 29A can be formed in the same or different step as Conductive interconnect portion 30A. The conductor material of 29A can be same or different as 30A. The interconnect wordline 30A damascene structure can be formed by dry etching or chemical mechanical polishing, but is preferably formed by chemical mechanical polishing. The interconnect wordline 30A can be a low-resistivity conductor such as tungsten, aluminum, aluminum alloy, copper or copper alloy, but is preferably aluminum or copper that provides lower resistivity.

Figure 4:
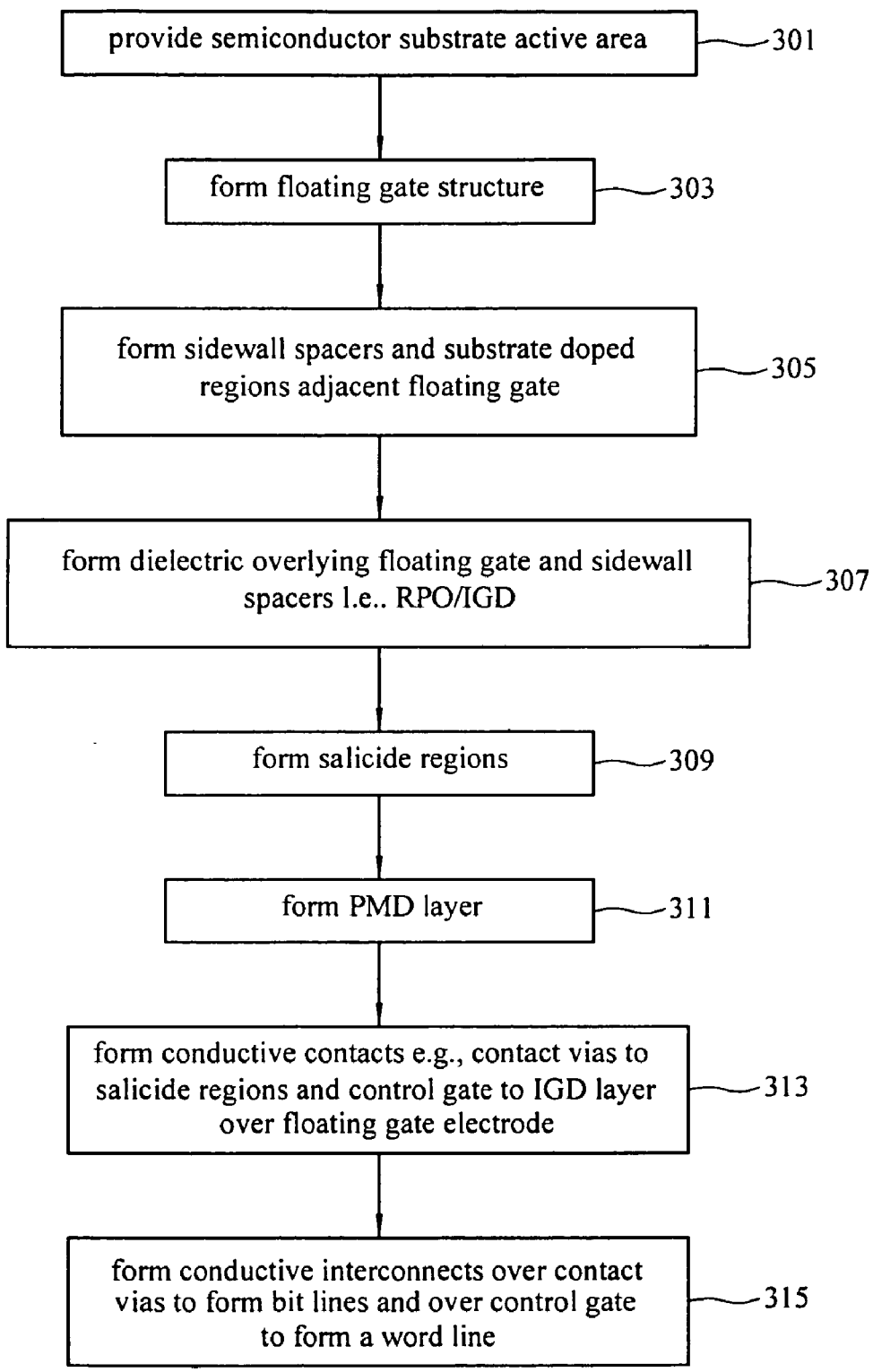
FIG. 4 is a process flow diagram including several embodiments of the present invention.

Referring to FIG. 4, is shown a process flow diagram including several embodiments of the present invention. In process 301, a semiconductor substrate active area is provided. In process 303, a floating gate structure with a gate electrode and tunnel oxide is formed on the semiconductor substrate active area. In process 305, sidewall spacers are formed adjacent either side of the gate structure together with the formation of substrate doped regions including LDD and S/D regions adjacent the gate structure. In process 307, a dielectric layer is formed over the gate structure and sidewall spacers functioning as an IGD layer (1st embodiment) and/or protective dielectric layer (2d embodiment). In process 309, salicide regions are formed over the S/D regions. In process 311, a PMD layer is formed over the gate structure. In process 313, conductive damascene contacts are formed including contact vias to contact the salicide regions and a control gate where the conductive portion is in contact with an IGD layer overlying the floating gate structure (in 2d embodiment IGD layer formed to line the control gate contact opening). In process 315, conductive interconnects are formed over the contact vias to form bit lines and over the control gate to form a word line.

The preferred embodiments, aspects, and features of the invention having been described, it will be apparent to those skilled in the second art that numerous variations, modifications, and substitutions may be made without departing from the spirit of the invention as disclosed and further claimed below.

What is claimed is:

1. A programmable non-volatile memory (PNVM) device comprising:
    a semiconductor substrate active area;
    a gate dielectric on the active area;
    a floating gate electrode on the gate dielectric;
    an inter-gate dielectric disposed over the floating gate electrode; and,
    a control gate electrode disposed as a liner layer within a contact opening to comprise a liner control gate electrode, said contact opening extending through a dielectric insulating layer to said inter-gate dielectric, said control gate electrode contacting the inter-gate dielectric, the control gate electrode disposed over an upper portion of the floating gate electrode, said control gate electrode having a bottommost width less than a topmost width of said floating gate electrode.

2. The PNVM device of claim 1, further comprising a conductive contact via disposed adjacent the floating gate electrode extending through the dielectric insulating layer to contact metal silicide regions disposed over semiconductor substrate doped regions.

3. The PNVM device of claim 2, further comprising a first conductive interconnect line disposed over the conductive contact via to form a bit line.

4. The PNVM device of claim 1, further comprising a second conductive interconnect line disposed over the control gate electrode to form a word line.

5. The PNVM device of claim 1, wherein the inter-gate dielectric is disposed over the floating gate electrode.

6. The PNVM device of claim 5, further comprising a contact etch stop layer disposed on the inter-gate dielectric.

7. The PNVM device of claim 1 further comprising sidewall spacers that comprise material layers selected from the group consisting of oxides and nitrides.

8. The PNVM device of claim 7, wherein the sidewall spacers comprise L-shaped spacers.

9. The PNVM device of claim 1, wherein the inter-gate dielectric comprises a liner layer lining said contact opening.

10. The PNVM device of claim 9, wherein the contact opening extends through a protective oxide layer to contact the floating gate electrode.

11. The PNVM device of claim 1, wherein the inter-gate dielectric comprises a dielectric selected from the group consisting of plasma formed silicon oxide, oxide/nitride/oxide, and high-K dielectrics.

12. The PNVM device of claim 11, wherein the high-K dielectrics are selected from the group consisting of aluminum oxides, hafnium oxides, hafnium oxynitrides, hafnium silicates, hafnium silicon oxynitrides, zirconium oxides, zirconium oxynitrides, zirconium silicon oxides, yttrium oxides ($Y_2O_3$), lanthanum oxides ($La_2O_3$), cerium oxides ($CeO_2$), titanium oxides ($TiO_2$), tantalum oxides ($Ta_2O_5$), and combinations thereof.

13. The PNVM device of claim 1, wherein the inter-gate dielectric has an equivalent oxide thickness of from about 50 Angstroms to about 200 Angstroms.

14. The PNVM device of claim 1, wherein the floating gate electrode comprises a material selected from the group consisting of polysilicon, amorphous polysilicon, doped polysilicon, polysilicon-germanium, metal, metal compound, and combinations thereof.

15. The PNVM device of claim 1, wherein the control gate electrode comprises a conductor selected from the group consisting of tungsten, aluminum, aluminum alloy, copper, copper alloy, metal nitride, and combinations thereof.

16. The PNVM device of claim 1, further comprising a conductive interconnect line disposed over the liner control gate electrode, said conductive interconnect line disposed within said contact opening.

17. A programmable non-volatile memory (PNVM), device comprising:
   a semiconductor substrate active area;
   a gate dielectric on the active area;
   a floating gate electrode on the gate dielectric;
   an inter-gate dielectric disposed over the floating gate electrode; and,
   a liner control gate electrode disposed as a liner layer within a contact opening, said contact opening extending through a dielectric insulating layer to said inter-gate dielectric, said liner control gate electrode contacting the inter-gate dielectric, the liner control gate electrode disposed on sidewalls within the contact opening and over an upper, portion of the floating gate electrode to line the contact opening, said liner control gate electrode having a bottommost width less than a topmost width of said floating gate electrode.

18. The PNVM device of claim 17, further comprising a conductive interconnect line disposed over the liner control gate electrode, said conductive interconnect line disposed within said contact opening.

19. The PNVM device of claim 17, wherein the liner control gate electrode is on top of the inter-gate dielectric, said inter-gate dielectric lining said contact opening to contact said floating gate electrode.

* * * * *